(12) United States Patent
Wen et al.

(10) Patent No.: US 6,635,219 B2
(45) Date of Patent: Oct. 21, 2003

(54) METHOD OF REGENERATING A PHASE-CHANGE SPUTTERING TARGET FOR OPTICAL STORAGE MEDIA

(75) Inventors: Jyh-Chung Wen, Hsinchu (TW); Ming-Shyong Lai, Hsinchu (TW); Bean-Jon Li, Hsinchu (TW)

(73) Assignee: Industrial Technology Research Institute (TW)

( * ) Notice: Subject to any disclaimer, the term of this patent is extended or adjusted under 35 U.S.C. 154(b) by 0 days.

(21) Appl. No.: 10/094,812

(22) Filed: Mar. 12, 2002

(65) Prior Publication Data

US 2002/0130041 A1 Sep. 19, 2002

(30) Foreign Application Priority Data

Mar. 13, 2001 (TW) ........................................ 90105821 A

(51) Int. Cl.⁷ ............................... B22F 3/12; B22F 7/04
(52) U.S. Cl. ................................................ 419/5; 419/8
(58) Field of Search .......................................... 419/5, 8

(56) References Cited

U.S. PATENT DOCUMENTS

| | | | | |
|---|---|---|---|---|
| 5,522,535 A | * | 6/1996 | Ivanov et al. | 228/122.1 |
| 5,593,082 A | * | 1/1997 | Ivanov et al. | 228/122.1 |
| 5,653,856 A | * | 8/1997 | Ivanov et al. | 204/192.12 |
| 5,660,599 A | * | 8/1997 | Schlott et al. | 264/122 |
| 5,799,860 A | * | 9/1998 | Demaray et al. | 228/194 |
| 6,071,323 A | * | 6/2000 | Kawaguchi | 75/246 |

FOREIGN PATENT DOCUMENTS

JP 63-93859 * 4/1988

OTHER PUBLICATIONS

Abstract Publication No. JP 63093859A, Apr. 25, 1988.*
Japan Patent No. JP362230967A, Oct. 9, 1987.*
Japan patent No. 411228219A, Aug. 24, 1999.*
Japan Patent No. 411269639A, Oct. 5, 1999.*
Patent Abstract of Japan, Publication No. 2000–239837, May 2000.*

* cited by examiner

*Primary Examiner*—Ngoclan Mai
(74) *Attorney, Agent, or Firm*—Birch, Stewart, Kolasch & Birch, LLP

(57) ABSTRACT

A method of regenerating a phase-change sputtering target for optical storage media. First, a used powder-metallurgy sputtering target composed of a target material, an adhesion material, and a backing plate is recycled. Then, the target material is separated from the backing plate. Then, the target adhesion material is scraped from the recycled target material. Thereafter, the surface of the recycled target material is processed. Finally, the backing plate, a new adhesion material, the recycled target material, and new powders are placed in a vacuum thermal-pressure furnace in sequence to perform a thermal-pressure sintering process. This completes a new phase-change sputtering target

14 Claims, 1 Drawing Sheet

METHOD OF REGENERATING A PHASE-CHANGE SPUTTERING TARGET FOR OPTICAL STORAGE MEDIA

BACKGROUND OF THE INVENTION

1. Field of the Invention

The present invention relates to a method of regenerating a sputtering target and, more particularly, to a method of regenerating a phase-change sputtering target for optical storage media.

2. Description of the Related Art

Phase-change erasable optical recording media, such as CD-RW, DVD-RW or DVD-RAM, can repeatedly read and rewrite to achieve a large number of records. The phase-change erasable optical recording media uses a phase-change material as a recording layer, and uses a focused laser beam serving as a heat source to irradiate a micron-scale region on the recording layer, resulting in a reversible transformation generated between the crystalline phase and the amorphous phase of the phase-change material on the irradiated region. Thus, the different optical properties of the crystalline phase and the amorphous phase of the phase-change material can determine the states of the irradiated regions. Under conditions in which each irradiated region has the same crystalline structure, the information of a unit cell is stored in a small spot of the amorphous phase. The performance of the recording layer depends on the quality of a phase-change sputtering target for optical storage media and the sputtering technique.

Generally, a phase-change sputtering target comprises a target material, an adhesion material and a backing plate of copper alloy. According to various phase-change types, the phase-change target material is classified as: (1) amorphous phase→crystalline phase (irreversible), such as Te—$TeO_2$, Te—$TeO_2$—Pd, $Sb_2Se_3$/$Bi_2Te_3$, Ge—Te—Sb and Ag—In—Sb—Te; (2) amorphous phase→crystalline phase (reversible), such as Ge—Te—Sb, Ag—In—Sb—Te, Te—$TeO_2$—Ge—Sn, Te—Ge—Sn—Au, Sn—Se—Te, Sb—Se—Te, Sb—Se, Ga—Se—Te, Ga—Se—Te—Ge, In—Se, In—Se—Tl—Co, Ge—Te—Sb—S, In—Sb—Te, In—Se—Te and Ge—Te—Sn; (3) crystalline phase→crystalline phase, such as Ab—Zn, Cu—Al—Ni, In—Sb and In—Sb—Se. Preferably, the series of Ge—Sb—Te and Ag—In—Sb—Te are in common use.

However, in planar magnetron sputtering, the sputtering ions' orbit along a specific trajectory caused by the magnetic field leads to the appearance of non-uniform erosion on the target material. Therefore the sputtering target needs to be renewed when the sputtering target is employed reaching a predetermined time or a fixed quantity in order to prevent damage to the backing plate from the penetration by the sputtering ions. As a rule, the percentage of real use for a rectangular-shaped sputtering target is less than 28%, for a circular-shaped sputtering target, less than 35%, and commercial-use sputtering targets are controlled about 25%. In addition, compared with ordinary metallic target material, the phase-change target material is rather costly and more than 70~75% of the phase-change target material cannot be recycled. Thus, a method of regenerating the phase-change sputtering target to increase the useable percentage of the target material, avoid its waste thereby reducing process costs, is called for.

SUMMARY OF THE INVENTION

The present invention provides a method of recycling a used powder-metallurgy sputtering target and thermal-pressure sintering thereof to regenerate a new powder-metallurgy sputtering target.

The present invention provides a method of regenerating a phase-change sputtering target for optical storage media. First, a used powder-metallurgy sputtering target composed of a target material, an adhesion material, and a backing plate is recycled. Then, the target material is separated from the backing plate. Next, the adhesion material is scraped from the recycled target material. Thereafter, the surface of the recycled target material is processed. Finally, the backing plate, a new adhesion material, the recycled target material, and new powders are placed in a vacuum thermal-pressure furnace in sequence to perform a thermal-pressure sintering process. This completes a new phase-change sputtering target.

Accordingly, it is a principal object of the invention to provide a method of regenerating a powder-metallurgy sputtering target to increase the utility rate of the backing plate.

It is another object of the invention to provide a method of regenerating a powder-metallurgy sputtering target to decrease material cost.

Yet another object of the invention is to provide a method of regenerating a powder-metallurgy sputtering target to increase the useable percentage of the target material.

It is a further object of the invention to provide a method of regenerating a powder-metallurgy sputtering target to avoid waste of the target material.

These and other objects of the present invention will become readily apparent upon further review of the following specification and drawings.

BRIEF DESCRIPTION OF THE DRAWINGS

Similar reference characters denote corresponding features consistently throughout the attached drawings.

DETAILED DESCRIPTION OF THE PREFERRED EMBODIMENTS

Figure 1:
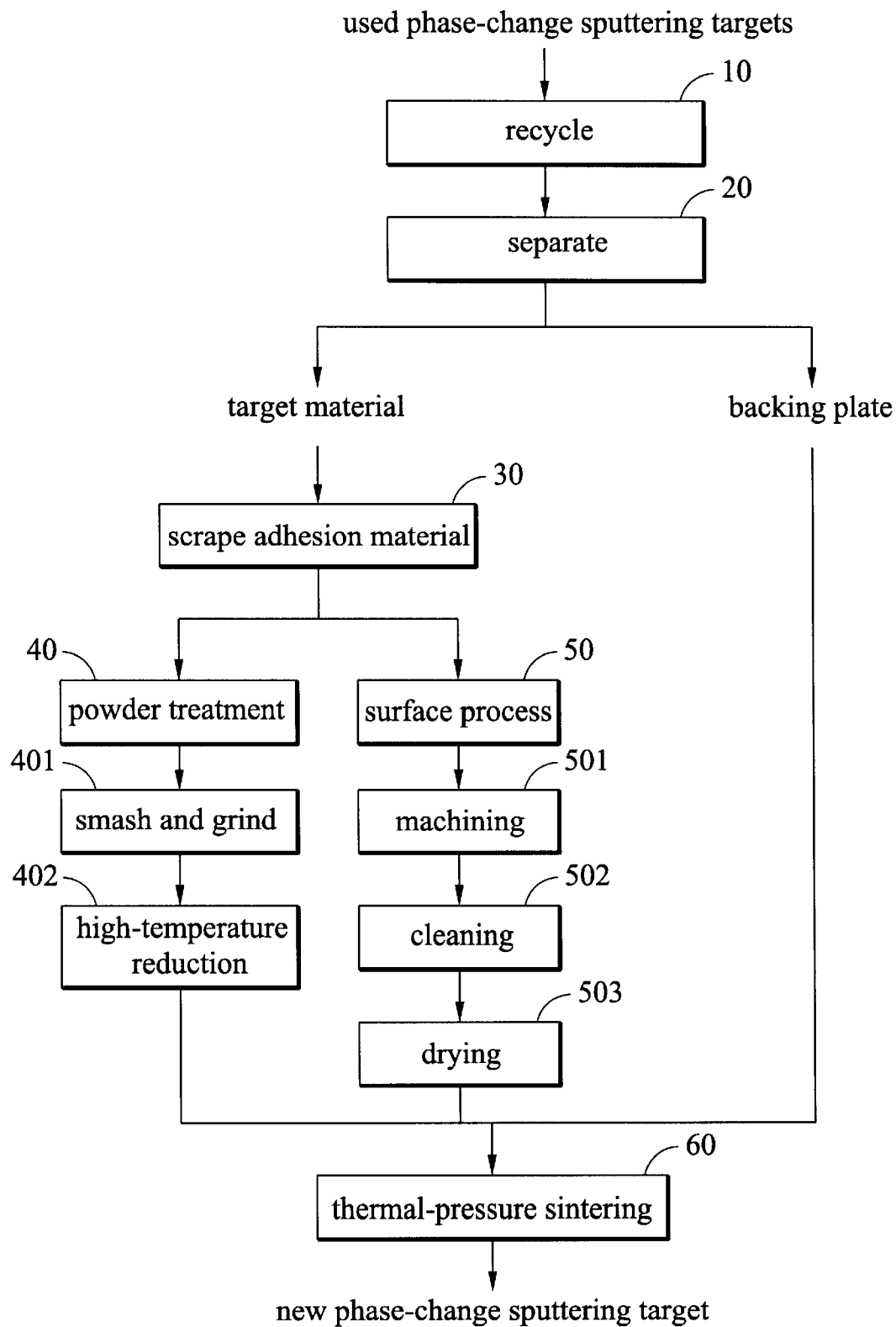
FIG. 1 is a flow chart showing a method of regenerating a phase-change sputtering target.

The present invention provides a method of regenerating a phase-change sputtering target, in which the used target material of a used target is recycled to regenerate a new phase-change sputtering target. The present invention is applied to the regeneration of a used target material composed of any kind of powder-metallurgy materials.

FIG. 1 is a flow chart showing a method of regenerating a phase-change sputtering target. First, in step 10, used phase-change sputtering targets are recycled from optical disc factories. Then, in step 20, using heating treatment, the recycled sputtering targets are placed in a high-temperature oven at 200~300° C. for 10~30 minutes, thus separating the target material from the backing plate of copper alloy. Next, in step 30, an adhesion material, such as In, is scraped away from the target material.

Thereafter, a powder treatment and a surface process are selectively carried out depending on the shape, size and performance of the recycled target material. For the small-size recycled target material, the step 40 of powder treatment is required. First, in step 401, using a grinder is with a protective atmosphere, the recycled target material is smashed and ground to be shaped as recycled powders of 60~120 μm diameter. Then, in step 402, in order to prevent the recycled powders from oxidation, the recycled powders are put into a hydrogen oven to undergo a high-temperature reduction at 450° C. for 2~4 hours.

For block-size recycled target material, the step 50 of surface process is required. First, in step 501, using micro machining such as lathing, contamination on the recycled target material is scraped till the surface reaches a predetermined roughness. Then, in step 502, using a water-washing method, the oil sludge on the roughened surface of the recycled target material is cleaned off. Next, in step 503, using a dry treatment, the recycled target material is placed in a vacuum oven at 120° C. for 2~3 hours.

After completing the above-mentioned steps of recycling and regenerating, in step 60 of a thermal-pressure sintering process is finally performed to form the recycled target material or powders, the recycled backing plate and an extra adhesion material as a new sputtering target by controlling process parameters, such as sintering temperature, pressure, sintering atmosphere, sintering time, mold design and pressurized rout. The new phase-change sputtering target obtains great density approximately close to theoretical density. In a vacuum thermal-pressure furnace, the backing plate is placed in a mold of the same size, a piece of adhesion material (such as In) is placed on the backing plate, the recycled target material is placed on the adhesion material, and new phase-change powders or recycled target powders are added on the adhesion material. Before the thermal-pressure sintering, the furnace is at a high-vacuum status about $10^{-5 \sim -7}$ torr to rid it of residual moisture and atmosphere. Then, hydrogen (content of $H_2$ more than 10%) is provided at 350~450° C. for 1~3 hours. Thereafter, a pressure of 500 Kg/cm$^2$ is provided. This shapes a new phase-change sputtering target, whose density is about 6.368 g/cm$^3$ more than 99% of the theoretical density.

The present invention can add new powders to the recycled target materials or use recycled target powders to regenerate a phase-change sputtering target, thus the utility rate of the backing plate is increased. Also, the additive quantity of the new powder assists in compensating for the loss of the target material. This can decrease material costs.

It is to be understood that the present invention is not limited to the embodiments described above, but encompasses any and all embodiments within the scope of the following claims.

What is claimed is:

1. A method of regenerating a powder-metallurgy sputtering target, comprising steps of:
   (a) recycling a used powder-metallurgy sputtering target which comprises a target material made by powder metallurgy, an adhesion material and a backing plate of alloy;
   (b) separating the target material from the backing plate
   (c) scraping the adhesion material from the target material;
   (d) processing the surface of the target material; and
   (e) placing the backing plate, a new adhesion material, the target material and new powder in sequence into a vacuum thermal-pressure furnace to perform a thermal-pressure sintering process to form a new powder-metallurgy sputtering target.

2. The method according to claim 1, wherein step (b) heats the target material at 200~300° C. for 10~30 minutes.

3. The method according to claim 1, wherein step (d) comprises:
   (d1) machining the surface of the target material to remove contamination therefrom and bring the surface of the target material to a predetermined roughness;
   (d2) cleaning the surface of the target material; and
   (d3) drying the surface of the target material.

4. The method according to claim 3, wherein step (d2) uses a water-washing method to remove oil sludge from the roughened surface of the target material.

5. The method according to claim 3, wherein step (d3) bakes the target material in a vacuum oven.

6. The method according to claim 1, further comprising, after completing step (b), a step (f): using a powder treatment to form the target material as recycled powders.

7. The method according to claim 6, wherein step (e) adds the recycled powders to the target material in the vacuum thermal-pressure furnace.

8. The method according to claim 6, wherein the recycled powders can replace the new powders used in step (e).

9. The method according to claim 6, wherein step (f) comprises:
   (f1) smashing the target material;
   (f2) grinding the target material to form the recycled powders; and
   (f3) performing a high-temperature reduction on the recycled powders.

10. The method according to claim 1, wherein the used powder-metallurgy sputtering target is a phase-change sputtering target.

11. The method according to claim 1, wherein the target material is of phase-change materials.

12. The method according to claim 1, wherein the backing plate is copper alloy.

13. The method according to claim 1, wherein the adhesion material is indium (In).

14. The method according to claim 1, wherein the new powders used in step (e) and the target material are the same powder-metallurgy material.

* * * * *